United States Patent [19]
Shi et al.

[11] Patent Number: 5,959,880
[45] Date of Patent: Sep. 28, 1999

[54] LOW ASPECT RATIO MAGNETORESISTIVE TUNNELING JUNCTION

[75] Inventors: Jing Shi; Theodore Zhu, both of Chandler; Saied N. Tehrani, Tempe; Eugene Chen, Gilbert; Mark Durlam, Chandler, all of Ariz.

[73] Assignee: Motorola, Inc., Schaumburg, Ill.

[21] Appl. No.: 08/993,996

[22] Filed: Dec. 18, 1997

[51] Int. Cl.$^6$ .................................................. G11C 11/00
[52] U.S. Cl. ........................................... 365/158; 365/173
[58] Field of Search ..................... 365/171, 173, 365/158

[56] References Cited

U.S. PATENT DOCUMENTS

| | | | |
|---|---|---|---|
| 5,595,830 | 1/1997 | Daughton | 428/611 |
| 5,764,567 | 6/1998 | Parkin | 365/173 |
| 5,793,697 | 8/1998 | Scheuerlein | 365/171 |
| 5,801,984 | 9/1998 | Parkin | 365/158 |

*Primary Examiner*—David Nelms
*Assistant Examiner*—M. Tran
*Attorney, Agent, or Firm*—Eugene A. Parsons; William E. Koch

[57] ABSTRACT

A low aspect ratio magnetoresistive tunneling junction memory cell includes two layers of magnetoresistive material separated by electrically insulating material so as to form a magnetoresistive tunneling junction. An exchange interaction layer is sandwiched between one layer of the junction and a third layer of magnetoresistive material so as to pin the magnetic vector of one layer of the junction anti-parallel to a magnetic vector in the third layer so that magnetostatic interaction between the junction layers is canceled and the magnetic vector of the one layer is free to move in either of the two directions parallel to the polarization axis. Antiferromagnetic material is positioned adjacent the third layer so as to fix the magnetic vector in the third layer uni-directionally parallel to the polarization axis.

15 Claims, 3 Drawing Sheets

LOW ASPECT RATIO MAGNETORESISTIVE TUNNELING JUNCTION

FIELD OF THE INVENTION

The present invention pertains to magnetoresistive tunneling junctions for memory cells and more specifically to very small tunneling junctions for very high density arrays of memory cells.

BACKGROUND OF THE INVENTION

A magnetic random access memory (MRAM) is a non-volatile memory which basically includes a magnetoresistive (MR) material, a sense line, and a word line. The MRAM employs the MR effect to store memory states. Magnetic vectors in one or all of the layers of MR material are switched very quickly from one direction to an opposite direction when a magnetic field is applied to the MR material over a certain threshold. According to the direction of the magnetic vectors in the MR material, states are stored, for example, one direction can be defined as a logic "0", and another direction can be defined as a logic "1". The MR material maintains these states even without a magnetic field being applied. The states stored in the MR material can be read by passing a sense current through the cell in a sense line because of the difference between the magnetic resistances of the two states.

In very high density arrays of magnetic memory cells the size of individual cells becomes very small if the array is constructed small enough to be useful in present day electronic devices. As the size of individual cells becomes smaller the aspect ratio (length/width ratio) generally becomes smaller. In two layer magnetic memory cells, e.g. standard tunneling junction cells, as the aspect ratio goes below 5, magnetic vectors in the cells are antiparallel in non-energized (zero magnetic field) conditions. In a copending application entitled "Multi-Layer Magnetic Memory Cells with Improved Switching Characteristics", Ser. No. 08/723,159, filed on Sep. 25 1996, and assigned to the same assignee, methods of reading cells with antiparallel magnetic vectors are disclosed. Also, in a copending application entitled "Magnetic Device Having Multi-Layer s with Insulating and Conductive Layers", Ser. No. 08/834,968, filed on Apr. 7, 1997, and assigned to the same assignees, a dummy magnetic layer is added to a two magnetic layer stack and coupled to one of the two magnetic layers so that the other magnetic layer is a free layer. A drawback of the dummy magnetic layer approach is that it relies on cancellation of magnetostatic interaction between the two magnetic layers and this magnetostatic interaction strength depends on the geometry of the cell and the interlayer spacing. These parameters change as the critical dimension shrinks.

Accordingly, it is highly desirable to provide magnetic random access memories and memory cells which are capable of being written (stored states switched) with less magnetic field.

It is another purpose of the present invention to provide a new and improved multi-state, multi-layer magnetic memory cell with an uncoupled magnetic free layer which switches states with a relatively low magnetic field.

It is still another purpose of the present invention to provide a new and improved multi-state, multi-layer magnetic memory cell with an uncoupled magnetic free layer which can be fabricated very small and with an aspect ratio less than 5.

It is a still further purpose of the present invention to provide a new and improved multi-state, multi-layer magnetic memory cell which is simpler to manufacture and to use.

It is also a purpose of the present invention to provide a new and improved multi-state, multi-layer magnetic memory cell which, because of its size, results in a high density array of cells.

SUMMARY OF THE INVENTION

The above problems and others are at least partially solved and the above purposes and others are realized in a low aspect ratio magnetoresistive tunneling junction memory cell including two layers of magnetoresistive material separated by electrically insulating material so as to form a magnetoresistive tunneling junction. Each magnetoresistive layer of the junction includes a fixed polarization axis and a magnetic vector directed in either of two directions parallel to the polarization axis. An exchange interaction layer is situated in parallel juxtaposition between the one magnetoresistive layer of the junction and a third layer of magnetoresistive material so as to pin the magnetic vector of the one magnetoresistive layer of the junction anti-parallel to a magnetic vector in the third layer. Thus, magnetostatic interaction between the junction layers is canceled and the magnetic vector of the other layer of the junction is free to move in either of the two directions parallel to the polarization axis. An antiferromagnetic material is positioned adjacent to the third layer so as to fix the magnetic vector in the third layer uni-directionally parallel to the polarization axes of the first and second magnetoresistive layers.

Generally, the first and second layers each have a length/width ratio in a range of 1 to 5 and may have any of a variety of shapes including but not limited to round, diamond, and elliptical with the polarization axis being defined by a forced easy axis. The easy axis may be forced in a variety of ways including setting the easy axis by either applying a magnetic field during growth or annealing the wafer under a magnetic field subsequent to growth.

BRIEF DESCRIPTION OF THE DRAWINGS

Referring to the drawings.

DESCRIPTION OF THE PREFERRED EMBODIMENT

Figure 1:
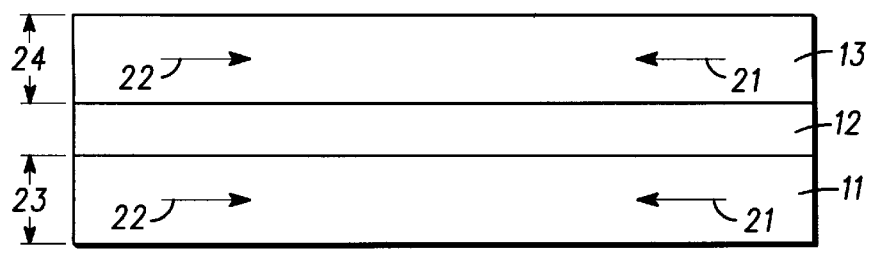
FIG. 1 is a simplified side view of a multi-layer tunneling magnetic memory cell.

Turning now to the drawings, FIG. 1 illustrates an enlarged, simplified side view of a magnetic memory cell 10 having multiple layers that are ferromagnetically coupled.

Cell 10 includes a first magnetic layer 11 and a second magnetic layer 13, which are separated by a first conducting or insulating spacer layer 12. Magnetic layers 11 and 13 each can be single layers of ferromagnetic materials such as a layer of nickel, iron, cobalt, or alloys thereof including alloys having palladium or platinum therein. Alternatively, either of layers 11 and 13 can be a composite ferromagnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 12 include most conductive materials such as Cu, Ag, Au, Cr and their alloys, or most non-conductive materials such as oxides, nitrides, dielectrics, etc.

Although shown having two magnetic layers in this embodiment, cell 10 can have more than two magnetic layers including third and fourth magnetic layers (not shown), that typically are similar to layers 11 and 13 but may be formed of different materials or have different thicknesses, and are separated by second and third conductive or non-conductive spacer layers, respectively, (not shown) that are similar to layer 12.

In prior art structures, layers 11 and 13 are rectangular and each have magnetization vectors 21 that are positioned substantially along the length of the cell and maintained parallel to the length by the physical anisotropy. To achieve this, the width is formed to be smaller than the width of the magnetic domain walls or transition width within layers 11 and 13. Typically, widths of less than 1.0 to 1.2 microns result in such a constraint. Generally, to achieve high density the width is less than one micron and is as small as can be made by manufacturing technology, and the length is greater than the width. Also, thicknesses 23 and 24 are approximately three to ten nanometers and thicknesses 23 and 24 may be different in some embodiments. The difference in thicknesses 23 and 24 affect the switching points of layers 11 and 13 and are utilized in some structures for reading and writing cells.

As illustrated in FIG. 1, vectors 21 and 22 in layers 11 and 13 represent two different states of magnetization within cell 10. It should be understood that these are the same vectors and that they are given different numbers only to indicate different states. One state is referred to as a logic "0". It and the other state is a logic "1". While it will be understood by those skilled in the art that any logic definition can be assigned to either state, in this example when vectors 21 of layers 11 and 13 both point to the left in FIG. 1, cell 10 is in a logic "0" state and when vectors 22 in both layers 11 and 13 are in the opposite direction cell 10 is in a logic "1" state. Thus, for a first state, magnetization vectors in both layers 11 and 13 point in a first direction and for a second state, magnetization vectors in both layers 11 and 13 point in an opposite direction.

In a tunneling junction type of magnetic cell, layer 12 is an insulating layer, the provision of which between ferromagnetic layers 11 and 13 produces a tunneling junction that allows a flow of current perpendicularly through layer 12, from layer 11 to layer 13 (or vice versa). Essentially, cell 10 appears as a relatively high impedance (referred to herein as a resistance R). When the magnetization vectors in layers 11 and 13 are antiparallel the resistance R of cell 10 remains very high. When the magnetization vectors in layers 11 and 13 are parallel, the resistance R of cell 10 drops perceptibly, as illustrated in FIG. 2.

In a specific example, layer 11 is formed of cobalt (Co) approximately 100 Å thick (generally in a range of 10 Å to 200 Å), layer 12 is formed of aluminum oxide ($Al_2O_3$) approximately 25 Å thick (generally in a range of 10 Å to 100 Å), and layer 13 is formed of nickel iron (NiFe) approximately 100 Å thick (generally in a range of 10 Å to 200 Å). The change of resistance versus the resistance ($\Delta R/R$) is approximately 15% in the present specific example and is generally in a range of 10% to 30%. Thus, the state of cell 10 is relatively easily sensed by passing a sense current therethrough from layer 11 to layer 13 (or vice versa). The change of resistance in cell 10 is easily read as a change in voltage drop across cell 10 which can conveniently be used in conjunction with memory arrays and the like. Utilizing the ratio $\Delta R/R=15\%$, it is clear that the change in voltage across cell 10 versus the voltage across cell 10 ($\Delta V/V$) becomes 15%. Thus, in this example in which the resistance of cell 10 is 60 kohms, the change of voltage ($\Delta V$) across cell 10 is approximately 45 mV for a 5 $\mu$A sensing current passing through cell 10.

Figure 2:
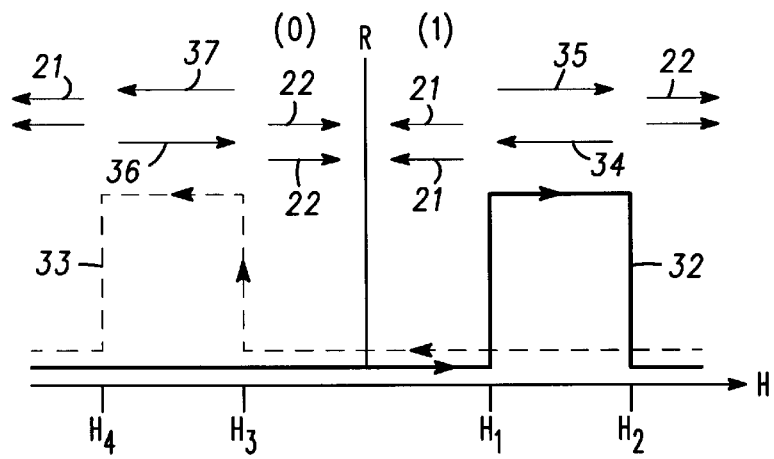
FIG. 2 is a graph generally illustrating switching characteristics of the cell of FIG. 1.

Referring specifically to FIG. 2, a graph is illustrated showing the resistance of cell 10 with an aspect ratio greater than five versus different directions of orientation for the magnetic vectors in layers 11 and 13. Also, the direction and strength of an applied magnetic field, required to achieve the various vector directions is shown. The abscissa of the graph indicates magnetic field direction and strength and the ordinate represents the resistance of cell 10. Further, a first curve 32 indicates the cell resistance which can be achieved for the application of various strengths of a magnetic field in a first direction and curve 33 indicates the cell resistance which can be achieved for the application of various strengths of a magnetic field in a second direction. Vectors 34 and 35 are illustrated with curve 32 and represent the magnetic vectors in layers 11 and 13, respectively, for the application of a magnetic field between values $H_1$ and $H_2$ in the positive direction along the abscissa. Similarly, vectors 36 and 37 are illustrated with curve 33 and represent the magnetic vectors in layers 11 and 13, respectively, for the application of a magnetic field between values $H_3$ and $H_4$ in the negative direction along the abscissa.

Assuming cell 10 is in the state in which vectors 21 both point to the left, moving to the right along the abscissa, the magnetic field increases up to a value $H_1$. Before the value $H_1$ is reached, magnetic vectors 21 are oriented in the same direction, designated a logic "1", and the resistance of cell 10 is low. Upon applying sufficient magnetic field to cell 10, herein designated by the value $H_1$, vector 35 switches to an opposite direction (as shown) and the resistance of cell 10 increases perceptibly. As the magnetic field is increased beyond a value $H_2$ vector 34 also switches to an opposite direction and the resistance of cell 10 again drops to a low value with the magnetic vectors now being represented by vectors 22. Similarly, if the magnetic field is applied in the opposite direction curve 33 applies and magnetic vector 37 of layer 13 switches at a value $H_3$ and the magnetic vector 36 of layer 11 switches at a value $H_4$, with the magnetic vectors now being represented by vectors 21. It should be noted that once the vectors of layers 11 and 13 are set in the orientation depicted by vectors 21 or 22 they will remain in that orientation, even after the applied magnetic field is removed, until a magnetic field sufficiently strong to switch them is applied.

Figure 3:
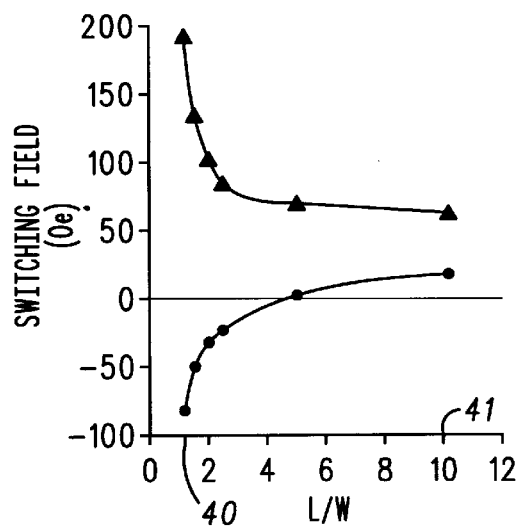
FIG. 3 is a graph illustrating the actual magnetic field required to switch the upper and lower layers, respectively, versus the length/width ratio of a magnetic cell, such as the cell illustrated in FIG. 1, with a fixed width.

Referring now to FIG. 3, the graph illustrated shows actual magnetic fields required to switch states of upper magnetic layer 13 and lower magnetic layer 11, respectively, in magnetic memory cell 10 of FIG. 1 versus the length/width ratio of the magnetic cell. The graph illustrated in FIG. 3 is developed using magnetic cells, such as cell 10 of FIG.

1, with a fixed width which in this specific example is 0.4 micrometers. Also, the length of the magnetic cells utilized to develop the graph of FIG. 3 range between 0.48 micrometers at a point 40 to 4.0 micrometers at a point 41. The graph of FIG. 3 illustrates that a magnetic field with a strength of less than approximately 20 Oersteds is sufficient to switch the state of layer 13 in cell 10 of FIG. 1 if the length/width ratio of cell 10 is in a range of approximately 4.5 to 10. The graph of FIG. 3 also illustrates that a magnetic field with a strength greater than approximately 60 Oersteds is required to switch the state of layer 11 in cell 10 of FIG. 1 if the length/width ratio of cell 10 is in a range of approximately 2 to 10.

An additional feature illustrated in FIG. 3, is that in cells having a length/width ratio of greater than approximately 4 the first and second layers of magnetic material are ferromagnetically coupled while in cells having a length/width ratio of less than approximately 4 the first and second layers of magnetic material are antiferromagnetically coupled. Generally, for purposes of this disclosure the term "ferromagnetically coupled" means that either of the parallel states (magnetic vectors 21 or 22, in FIG. 1) is stable and does not require a constant magnetic field. Also, for purposes of this disclosure the term "antiferromagnetically coupled" means that either of the antiparallel states is stable and that the parallel state is unstable and does require a constant magnetic field, since the magnetic vectors always tend to move to an antiparallel state.

Figure 4:
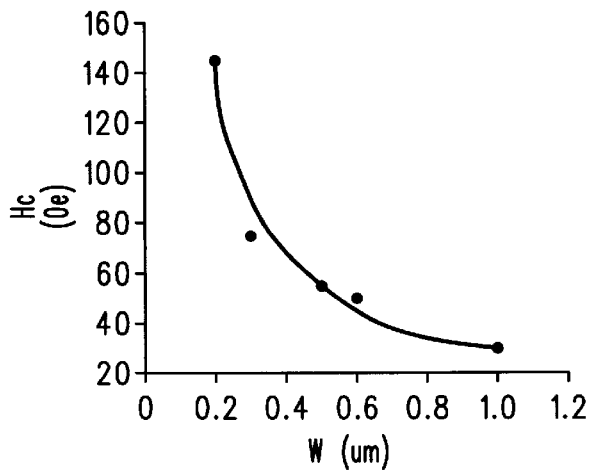
FIG. 4 is a graph illustrating the switching field required to write a cell versus the width of the cell.

Turning now to FIG. 4, a graph illustrating the switching field required to write a cell versus the width of the cell is illustrated. As illustrated in FIG. 4, if a magnetic memory cell has a net magnetic moment and an aspect ratio (i.e. L/W ratio) of one or greater, the switching field and, therefore, the current needed to write the cell, drastically increases as the cell width decreases.

Figure 5:
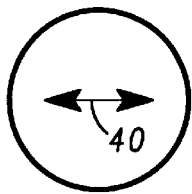
FIGS. 5–7 are plan views of different potential embodiments in accordance with the present invention for magnetic cells having low aspect ratios.
Figure 6:
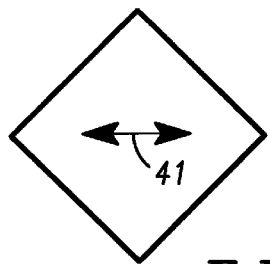
Figure 7:
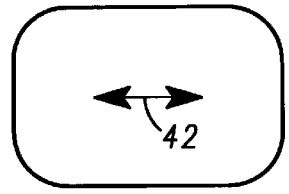

Referring to FIGS. 5–7, plan views of different potential embodiments in accordance with the present invention for magnetic cells having low aspect ratios are illustrated. When the aspect ratio of a single magnetic layer is close to one, such as for circular, square or diamond shaped, or elliptical, its switching field from shape anisotropy is minimum. In the case of circularly shaped cells, as illustrated in FIG. 5, the preferred magnetization direction, represented by a magnetic vector 40, is determined by uniaxial crystal field anisotropy (or magnetic crystalline anisotropy). This preferred magnetization direction is set during film deposition by a bias field or by annealing the film after deposition in a high magnetic field (e.g. several kOe) at elevated temperatures (e.g. 200° C. to 300° C.). In the case of a square or diamond shape, as illustrated in FIG. 6, the uniaxial crystal anisotropy, represented by magnetic vector 41, is set along a diagonal direction of the square. In the case of an elliptically shaped cell, illustrated in FIG. 7, the uniaxial crystal anisotropy, represented by magnetic vector 42, is set along the long axis of the cell. The main idea here is to minimize the shape effect, which contributes to the rise in required switching fields at narrow cell widths, and to utilize crystal field anisotropy to set the preferred magnetization direction needed by a memory cell.

As explained above, the magnetic moments or magnetic vectors, in a pair of magnetically coupled layers of a magnetic cell prefer to be antiparallel (antiferromagnetically coupled) when the aspect ratio of the cell is less than 5. Generally, to overcome the antiparallel effect, cancellation of magnetostatic interaction between the pair of layers is attempted. The problem is that the magnetostatic interaction strength depends on the geometry of the cell and the interlayer spacing and these parameters change as critical dimensions shrink. To make the cancellation perfect, yet insensitive to changes in the geometry, an exchange coupled two layer structure as illustrated in FIG. 8 is utilized.

Figure 8:
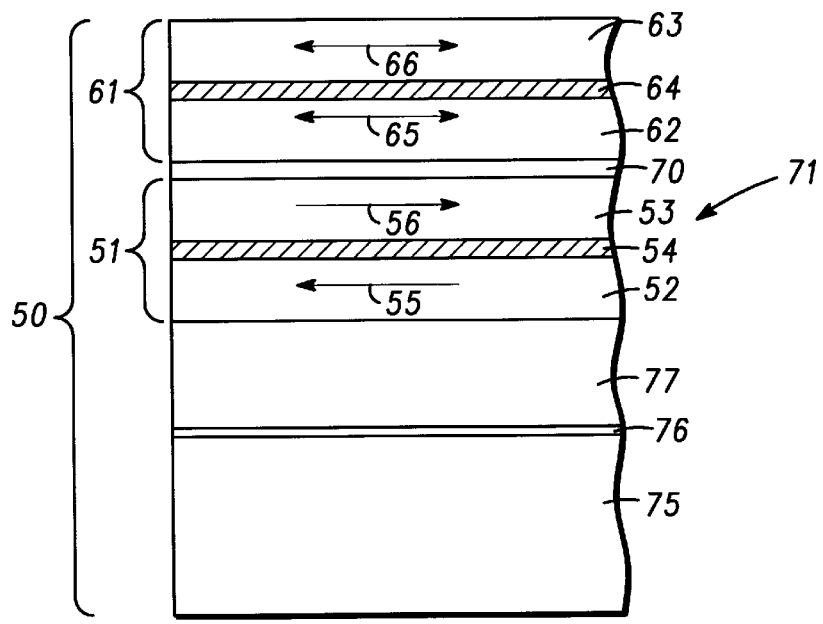
FIG. 8 is a simplified side view of a multi-layer tunneling magnetic memory cell in accordance with the present invention.

Referring specifically to FIG. 8, a simplified cross-sectional view is illustrated of a multi-layer tunneling magnetic memory cell 50 in accordance with the present invention. Cell 50 includes a first magnetoresistive layer 51 and a second magnetoresistive layer 52 stacked in parallel, overlying relationship and separated by an electrically insulating layer 53 so as to form a magnetoresistive tunneling junction 54, as described above. Cell 50 preferably has one of the shapes illustrated in FIGS. 5–7. Further, layer 51 includes a fixed polarization axis and a magnetic vector directed in either of two directions parallel to the polarization axis, represented by two headed arrow 55. Layer 52 includes a fixed polarization axis parallel to the polarization axis of layer 51 and a magnetic vector directed in a fixed direction parallel to the polarization axis, represented by single headed arrow 56.

An exchange interaction layer 58 is positioned adjacent layer 52 and a third magnetoresistive layer 59 is positioned adjacent exchange interaction layer 58 so as to situate exchange interaction layer 58 in parallel juxtaposition between layer 52 and layer 59. Layer 59 has a magnetic vector, represented by an arrow 60, which is always pinned anti-parallel to magnetic vector 56 in layer 52 by exchange coupling of exchange interaction layer 58. In some specific examples of an exchange coupled two layer structure (layers 52, 58 and 59) materials such as Co/Ru/Cu, NiFe/Ru/NiFe can be utilized, or multiples of the two layer structure can be, for example, {Co/Ru}×N, {Co/Cu}×N, etc., where N is the number of repetitions.

Because of the antiparallel orientations of the magnetizations 56 and 60, magnetic moments of layers 52 and 59 are canceled if they have the same thickness and magnetic vector 55 of layer 51 is free to move in either of the two directions parallel to the polarization axis. In addition to cancellation of the magnetostatic coupling, the exchange coupling reinforces the antiparallel magnetostatic interaction between layers 52 and 59, so that they always stay in antiparallel alignment. Therefore, tunneling junction 54 acts effectively as a single layer cell. Thus, layer 51 serves as the magnetic memory with the direction of magnetic vector 55 representing the information being stored. As an example, with magnetic vector 55 pointing to the left in FIG. 8 the information being stored could be a "0" and with magnetic vector 55 pointing to the right in FIG. 8 the information being stored could be a "1".

A magnetic cell which operates similar to the above described structure is disclosed in U.S. Pat. No. 5,640,343, entitled "Magnetic Memory Array Using Magnetic Tunneling Junction Devices in the Memory Cells", issued Jun. 17, 1997. When the aspect ratio of this type of cell is large, the shape anisotropy is strong enough to keep the bi-layer magnetization (layers 52 and 59 exchange coupled by layer 58) fixed and antiparallel to each other as described above. However, when the aspect ratio is small, as in the structures of FIGS. 4–7, the bi-layer magnetization will rotate under an external magnetic field and the detection of stored information is impossible.

To overcome this problem when utilizing very low aspect ratio magnetoresistive tunneling junction memory cells, a pinning layer 63 of magnetic material is positioned adjacent to layer 59 so as to fix the magnetic vector in layer 59 uni-directionally parallel to the polarization axes 55 or 56 of layers 51 or 52, respectively. Pinning layer 63 includes anti-ferromagnetic material, such as FeMn, NiMn, IrMn, or the like. The anti-ferromagnetic material does not have a net magnetic moment, so it does not exert additional magnetostatic field on layer 51. Thus, pinning layer 63 fixes the magnetic moment or magnetic vector 60 of layer 59 so that it cannot rotate and, hence, prevents rotation of the bi-layer magnetization.

Generally, magnetic cell 50, or arrays of similar magnetic cells, are fabricated on a substrate 65, which may be, for example, a semiconductor substrate or the like to facilitate the formation of control electronics therein. A seed layer 66 is formed on a planar surface of substrate 65, which seed layer is then used in the growth of subsequent layers formed thereon. Also, sense lines (not shown) are coupled to layer 51 and layer 52 to supply a sense current to tunneling junction 54 so that the vertical resistance of tunneling junction 54 and, hence the information stored in cell 50 can be sensed. Further, a word line (not shown) is positioned adjacent tunneling junction 54 so that information can be written into cell 50.

Figure 9:
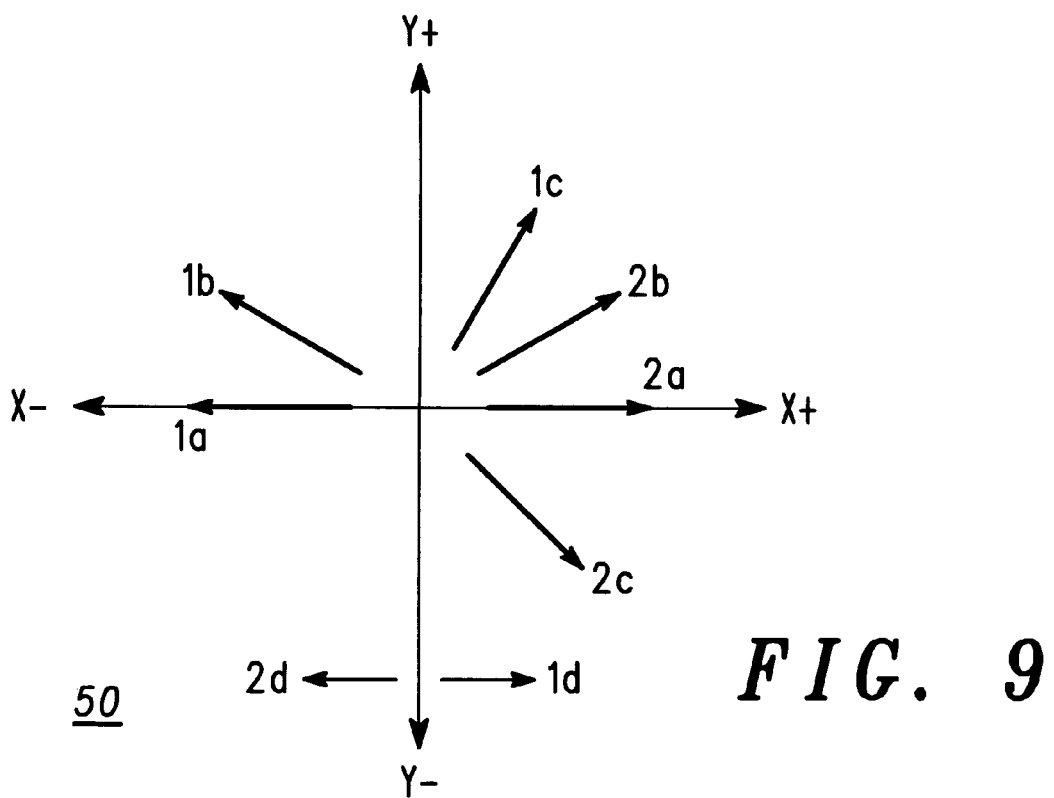
FIG. 9 is a simplified side view of another multi-layer tunneling magnetic memory cell in accordance with the present invention.

Turning now to FIG. 9, another embodiment is illustrated of a multi-layer tunneling magnetic memory cell 70 in accordance with the present invention. Cell 70 includes a first magnetoresistive layer 71 and a second magnetoresistive layer 72 stacked in parallel, overlying relationship and separated by an electrically insulating layer 73 so as to form a magnetoresistive tunneling junction 74, as described above. Cell 70 preferably has one of the shapes illustrated in FIGS. 5–7. Further, layer 71 includes a fixed polarization axis and a magnetic vector directed in either of two directions parallel to the polarization axis, represented by two headed arrow 75. Layer 72 includes a fixed polarization axis parallel to the polarization axis of layer 71 and a magnetic vector directed in a fixed direction parallel to the polarization axis, represented by single headed arrow 76.

An exchange interaction layer 78 is positioned adjacent layer 72 and a third magnetoresistive layer 79 is positioned adjacent exchange interaction layer 78 so as to situate exchange interaction layer 78 in parallel juxtaposition between layer 72 and layer 79. Layer 79 has a magnetic vector, represented by an arrow 80, which is always pinned anti-parallel to magnetic vector 76 in layer 72 by exchange coupling of exchange interaction layer 78. In this embodiment, the anti-parallel coupling between layers 72 and 79 is reinforced by the addition of flux closure material 90 positioned to enclose exposed edges of layer 72, exchange interaction layer 78, and layer 79. Flux closure material 90 is any soft magnetic material which encloses flux lines, or completes a magnetic circuit, between layers 72 and 79. Soft magnetic material 90 simply guides magnetic field lines from layers 72 and 79 into a closed loop and does not affect layer 71.

Thus, a new and improved magnetic cell for high density magnetic random access memories is disclosed which can be fabricated very small and with an aspect ratio less than 5. Further, the new and improved cell can be manufactured with a round, square or diamond, or elliptical shape to greatly increase the density and/or reduce the size of magnetic random access memories. The new and improved cell is capable of being written (stored states switched) with less magnetic field because it is capable of switching states with a relatively low magnetic field. Also, the new and improved multi-state, multi-layer magnetic memory cell is simpler to manufacture and to use.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A low aspect ratio magnetoresistive tunneling junction memory cell comprising:

first and second layers of magnetoresistive material stacked in parallel, overlying relationship and separated by electrically insulating material so as to form a magnetoresistive tunneling junction, the first layer including a fixed polarization axis and a magnetic vector directed in either of two directions parallel to the polarization axis, and the second layer including a fixed polarization axis parallel to the polarization axis of the first layer and a magnetic vector directed in a fixed direction parallel to the polarization axis;

an exchange interaction layer positioned adjacent the second layer of magnetic material;

a third layer of magnetoresistive material positioned adjacent the exchange interaction layer so as to situate the exchange interaction layer in parallel juxtaposition between the second and third layers, the third layer having a magnetic vector which is always pinned anti-parallel to the magnetic vector in the second layer by coupling of the exchange interaction layer, and magnetostatic interaction between the first and second layers is canceled and the magnetic vector of the first layer is free to move in either of the two directions parallel to the polarization axis; and antiferromagnetic material positioned adjacent the third layer so as to fix the magnetic vector in the third layer uni-directionally parallel to the polarization axes of the first and second layers.

2. A low aspect ratio magnetoresistive tunneling junction memory cell as claimed in claim 1 wherein the first and second layers each have a length/width ratio in a range of 1 to 5.

3. A low aspect ratio magnetoresistive tunneling junction memory cell as claimed in claim 2 wherein the first and second layers each have a top plan that is one of circular, diamond-shaped, or elliptical.

4. A low aspect ratio magnetoresistive tunneling junction memory cell as claimed in claim 1 wherein the antiferromagnetic material includes FeMn, NiMn, IrMn, or combinations thereof.

5. A low aspect ratio magnetoresistive tunneling junction memory cell as claimed in claim 1 including in addition flux closure material positioned to enclose exposed edges of the second, the exchange interaction and the third layers.

6. A low aspect ratio magnetoresistive tunneling junction memory cell comprising:

a substrate having a surface;

a layer of antiferromagnetic material positioned on the surface of the substrate;

a fixed polarization layer of magnetoresistive material positioned on the layer of magnetic material so that a polarization axis of the fixed polarization layer is fixed in a direction parallel to the surface of the substrate;

an exchange interaction layer positioned on the fixed polarization layer of magnetoresistive material; and first and second layers of magnetoresistive material stacked in parallel, overlying relationship on the exchange interaction layer and separated by electrically insulating material so as to form a magnetoresistive tunneling junction, each of the first and second layers including a fixed polarization axis parallel to the polarization axis of the fixed polarization layer and a magnetic vector directed in either of two directions parallel to the polarization axis, and the magnetic vector of the second layer being pinned by the fixed polarization layer and the exchange interaction layer uni-directionally parallel to the polarization axes of the first and second layers, whereby magnetostatic interaction between the first and second layers is canceled and the magnetic vector of the first layer is free to move in either of the two directions parallel to the polarization axis.

7. A low aspect ratio magnetoresistive tunneling junction memory cell as claimed in claim 6 wherein the first and second layers each have a length/width ratio in a range of 1 to 5.

8. A low aspect ratio magnetoresistive tunneling junction memory cell as claimed in claim 7 wherein the first and second layers each have a top plan that is one of circular, diamond-shaped, or elliptical.

9. A low aspect ratio magnetoresistive tunneling junction memory cell as claimed in claim 6 wherein the antiferromagnetic material includes FeMn, NiMn, IrMn, or combinations thereof.

10. A low aspect ratio magnetoresistive tunneling junction memory cell as claimed in claim 6 including in if addition flux closure material positioned to enclose exposed edges of the second, the exchange interaction and the third layers.

11. A method of fabricating a low aspect ratio magnetoresistive tunneling junction memory cell comprising the steps of:

providing first and second layers of magnetoresistive material stacked in parallel, overlying relationship and separated by electrically insulating material so as to form a magnetoresistive tunneling junction, the first layer including a fixed polarization axis and a magnetic vector directed in either of two directions parallel to the polarization axis, and the second layer including a fixed polarization axis parallel to the polarization axis of the first layer and a magnetic vector directed in a fixed direction parallel to the polarization axis;

positioning an exchange interaction layer adjacent the second layer of magnetic material;

positioning a third layer of magnetoresistive material adjacent the exchange interaction layer so as to situate the exchange interaction layer in parallel juxtaposition between the second and third layers, the third layer having a magnetic vector which is always pinned anti-parallel to the magnetic vector in the second layer by coupling of the exchange interaction layer so that magnetostatic interaction between the first and second layers is canceled and the magnetic vector of the first layer is free to move in either of the two directions parallel to the polarization axis; and positioning antiferromagnetic material adjacent the third layer so as to fix the magnetic vector in the third layer uni-directionally parallel to the polarization axes of the first and second layers.

12. A method of fabricating a low aspect ratio magnetoresistive tunneling junction memory cell as claimed in claim 11 including the step of forming the first and second layers each with a length/width ratio in a range of 1 to 5.

13. A method of fabricating a low aspect ratio magnetoresistive tunneling junction memory cell as claimed in claim 12 including the step of forming the first and second layers each with a top plan that is one of circular, diamond-shaped, or elliptical.

14. A method of fabricating a low aspect ratio magnetoresistive tunneling junction memory cell as claimed in claim 11 wherein the step of positioning antiferromagnetic material includes positioning one of FeMn, NiMn, IrMn, or combinations thereof.

15. A method of fabricating a low aspect ratio magnetoresistive tunneling junction memory cell as claimed in claim 11 including in addition positioning flux closure material adjacent to enclose exposed edges of the second, the exchange interaction and the third layers to enclose the exposed edges.

\* \* \* \* \*

UNITED STATES PATENT AND TRADEMARK OFFICE
CERTIFICATE OF CORRECTION

PATENT NO.    : 5,959,880                                           Page 1 of 1
DATED         : September 28, 1999
INVENTOR(S)   : Shi et al.

It is certified that error appears in the above-identified patent and that said Letters Patent is hereby corrected as shown below:

Column 1,
Line 2, after the Title, please add as a new first paragraph the following paragraph:
       -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*